United States Patent
Guo et al.

(10) Patent No.: US 9,324,769 B2
(45) Date of Patent: Apr. 26, 2016

(54) PIXEL ARRANGEMENT STRUCTURE, DISPLAY DEVICE AND DISPLAY METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, Beijing (CN); Peng Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/495,219

(22) Filed: Sep. 24, 2014

(65) Prior Publication Data

US 2015/0380471 A1 Dec. 31, 2015

(30) Foreign Application Priority Data

Jun. 30, 2014 (CN) .......................... 2014 1 0307378

(51) Int. Cl.
*G09G 3/32* (2006.01)
*H01L 27/32* (2006.01)

(52) U.S. Cl.
CPC .......... *H01L 27/3218* (2013.01); *G09G 3/3208* (2013.01); *G09G 2300/0443* (2013.01); *G09G 2300/0465* (2013.01)

(58) Field of Classification Search
CPC ................ G09G 3/3607; G09G 3/364; G09G 2300/0452
See application file for complete search history.

(56) References Cited

U.S. PATENT DOCUMENTS

| | | | | |
|---|---|---|---|---|
| 6,919,681 B2 * | 7/2005 | Cok | ..................... | G09G 3/3216 313/500 |
| 8,552,635 B2 * | 10/2013 | Kim | ..................... | G09G 3/2003 313/504 |
| 8,860,642 B2 * | 10/2014 | Phan | ....................... | H04N 9/30 345/589 |
| 2005/0270444 A1 * | 12/2005 | Miller | .................. | G09G 3/3216 349/108 |
| 2006/0158466 A1 * | 7/2006 | Chien | .................. | G09G 3/2074 345/694 |
| 2009/0121983 A1 * | 5/2009 | Sung | ................... | H01L 27/3218 345/76 |
| 2009/0128467 A1 * | 5/2009 | Chen | .................... | G09G 3/3607 345/87 |
| 2011/0260951 A1 * | 10/2011 | Hwang | ............. | G02F 1/134336 345/55 |

* cited by examiner

*Primary Examiner* — Kevin M Nguyen
(74) *Attorney, Agent, or Firm* — Harness, Dickey & Pierce, P.L.C.

(57) ABSTRACT

A pixel arrangement structure according to the present disclosure may include pixel units parallel to each other. The pixel units each includes a plurality of first pixels and second pixels spaced from each other. The first pixels each include a first sub-pixel located in a first row, a second sub-pixel located in a second row, and a third sub-pixel located in third and fourth rows. The second pixels each include a third sub-pixel located in the first and second rows, a first sub-pixel located in the third row, and a second sub-pixel located in the fourth row. The first sub-pixels and second sub-pixels are arranged horizontally, while the third sub-pixels are arranged longitudinally.

20 Claims, 8 Drawing Sheets

PARTIAL ENLARGED VIEW

PARTIAL ENLARGED VIEW

PARTIAL ENLARGED VIEW

PIXEL ARRANGEMENT STRUCTURE, DISPLAY DEVICE AND DISPLAY METHOD THEREOF

CROSS-REFERENCE TO RELATED APPLICATION

The present application claims a priority of the Chinese patent application No. 201410307378.6 filed in China on Jun. 30, 2014, which is incorporated herein by reference in its entirety.

TECHNICAL FIELD

The present disclosure relates to the field of display technology, in particular to a pixel arrangement structure, a display device and a display method thereof.

BACKGROUND

With the rapid improvement of display technology, semiconductor element technology, as the core of a display device, has also been improved dramatically. As for the existing display devices, Organic Light Emitting Diode (OLED) has been increasingly applied in the high-performance display field as a current-mode light-emitting device due to its features such as self-illumination, fast response, wide visual angle and possibility of being made on a flexible substrate, and so on.

Currently, in the preparation of an OLED display filter, three sub-pixels, namely red (R), green (G) and blue (B), are generally configured to constitute one pixel. A plurality of the above pixels are arranged in a matrix manner to form the above filter. Therefore, when a user watches a display, the resolution of his/her vision is precisely the physical resolution (actual resolution) of the display. Accordingly, in order to improve the display effect of a display, for example, to make the display image more vivid and delicate, it needs to adopt a design for improving PPI (pixels per inch), i.e., increasing the number of pixels per inch, during the process of manufacturing a display.

As for an OLED display, since its filter is made of red, green and blue light emitting organic materials, it is difficult and costly to form an organic resin pattern with high density and small area during the actual manufacturing process, which brings along a great challenge to the preparation process. Thus, use of the existing preparation process will restrict the high-PPI design of an OLED display, causing it difficult to improve the resolution of the OLED display, and reducing quality and image quality effect of the display image of the OLED display.

SUMMARY

Embodiments of the present disclosure provide a pixel arrangement structure, a display device and a display method thereof for realizing sharing of pixels.

In order to achieve the above purpose, embodiments of the present disclosure adopt the following technical solutions:

According to one aspect of the present disclosure, a pixel arrangement structure is provided. The pixel arrangement structure may include pixel units parallel to each other, and the pixel units each may include a plurality of first pixels and second pixels spaced from each other. The first pixels may include a first sub-pixel located in a first row, a second sub-pixel located in a second row, and a third sub-pixel located in third and fourth rows. The second pixels each may include a third sub-pixel located in the first and second rows, a first sub-pixel located in the third row, and a second sub-pixel located in the fourth row. The first sub-pixels and second sub-pixels may be arranged horizontally, while the third sub-pixels may be arranged longitudinally.

For example, the first sub-pixel may be red, the second sub-pixel may be green, and the third sub-pixel may be blue.

For example, the first sub-pixel may be green, the second sub-pixel may be blue, and the third sub-pixel may be red.

For example, the first sub-pixel may be blue, the second sub-pixel may be red, and the third sub-pixel may be green.

For example, a shape of the first sub-pixel, the second sub-pixel or the third sub-pixel may include rectangle.

According to another aspect of the present disclosure, a display device is provided. The display device may include: a receiving and processing unit configured to receive a first image signal and perform data processing; a sampling unit configured to provide one or more sampling areas on a plurality of pixel arrangement structures provided on a display substrate according to a processing result; a pixel sharing unit configured to share a plurality of first sub-pixels or second sub-pixels or third sub-pixels at a position corresponding to the sampling area so as to output a display signal after pixel sharing; and a display unit configured to display the first image signal according to the display signal after pixel sharing. Herein, each of the plurality of pixel arrangement structures may include pixel units parallel to each other, and the pixel units each may include a plurality of first pixels and second pixels spaced from each other. The first pixels each may include the first sub-pixel located in a first row, the second sub-pixel located in a second row, and a third sub-pixel located in third and fourth rows. The second pixels each may include a third sub-pixel located in the first and second rows, a first sub-pixel located in the third row, and a second sub-pixel located in the fourth row. The first sub-pixels and second sub-pixels may be arranged horizontally, while the third sub-pixels may be arranged longitudinally.

For example, a shape of the sampling area may be configured to be triangular, rhombic or hexagonal.

According to another aspect of the present disclosure, a display method is provided. The display method may include: receiving a first image signal and performing data processing; providing one or more sampling areas on a plurality of pixel arrangement structures provided on a display substrate according to a processing result; sharing a plurality of first sub-pixels or second sub-pixels or third sub-pixels at a position corresponding to the sampling area so as to output a display signal after pixel sharing; and displaying the first image signal according to the display signal after pixel sharing.

For example, the step of sharing a plurality of first sub-pixels or second sub-pixels or third sub-pixels at a position corresponding to the sampling area may include: setting one of the plurality of first sub-pixels or second sub-pixels or third sub-pixels distributed on a contour periphery of the sampling area as a primary sub-pixel; setting other sub-pixels of the plurality of first sub-pixels or second sub-pixels or third sub-pixels distributed on the contour periphery of the sampling area as secondary sub-pixels; setting the primary sub-pixel to output a primary display signal; setting the secondary sub-pixels to output shared display signals. Herein, the shared display signal may be a ratio signal of the primary display signal.

For example, the step of sharing a plurality of first sub-pixels or second sub-pixels or third sub-pixels at a position corresponding to the sampling area may include: setting one of the first sub-pixels or the second sub-pixels or the third sub-pixels located at a central position within a contour periphery of the sampling area as a primary sub-pixel; setting other sub-pixels of the first sub-pixels or the second sub-pixels or the third sub-pixels distributed on the contour periphery of the sampling area as secondary sub-pixels; setting the primary sub-pixel to output a primary display signal; setting the secondary sub-pixels to output shared display signals. Herein the shared display signal may be a ratio signal of the primary display signal.

For example, the method may further include: when the first image signal is switched into a second image signal, and the second image signal is different from the first image signal, changing a position of the primary sub-pixel so that the sampling area matches with the second image signal.

For example, within the sampling area, a number of the secondary sub-pixels for sharing may be configured to be 2 to 8.

For example, a shape of the sampling area may be configured to be triangular, rhombic or hexagonal.

According to the present disclosure, the pixel arrangement structure may include pixel units parallel to each other, the pixel units each including: a plurality of first pixels and second pixels spaced from each other, the first pixels each including a first sub-pixel located in a first row, a second sub-pixel located in a second row, and a third sub-pixel located in third and fourth rows; the second pixels each including a third sub-pixel located in the first and second rows, a first sub-pixel located in the third row, and a second sub-pixel located in the fourth row. Wherein, the first sub-pixels and second sub-pixels are arranged horizontally, while the third sub-pixels are arranged longitudinally. In this way, when the above pixel arrangement structure is configured to manufacture a display, a plurality of sampling areas may be provided on the pixel arrangement structure during the display process, a plurality of first pixels, second pixels or third pixels at a position corresponding to the sampling area can be shared, to improve the continuity of image display information at the above position of the sampling area. By means of the above virtual display driving, PPI can be increased, thereby improving the resolution of the display device and the quality and image quality effect of the display image.

DESCRIPTION OF THE DRAWINGS

To illustrate the solutions according to the embodiments of the present disclosure or in the prior art more clearly, the accompanying drawings needed for describing the embodiments or the prior art are introduced below briefly. Apparently, the accompanying drawings in the following descriptions merely show some of the embodiments of the present disclosure, and persons skilled in the art may obtain other drawings according to the accompanying drawings without creative efforts.

DETAILED EMBODIMENTS

The specific embodiments of the present disclosure will be described hereinafter in conjunction with the drawings and examples. The following examples are merely used to explain the present invention, but shall not be used to limit the scope of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. The described embodiments are just a part but not all of the embodiments of the present disclosure. All other embodiment(s) obtained by those skilled in the art based on the described embodiments herein should be within the scope of the present disclosure.

Unless otherwise defined, technical jargons or scientific terms used herein should be interpreted in the usual sense as understood by those ordinary skilled in the relevant art of the present disclosure. The terms "first", "second", and the like, used in the specification and claims of this patent application of the present disclosure, do not denote any order, quantity, or importance, but are used to distinguish among different integral parts. Similarly, the terms "a", "an", and the like, herein do not denote a limitation of quantity, but rather denote the presence of at least one of the referenced item. The phrases "connection" or "connected" or the like, are not limited to physical or mechanical connections, but may include electrical connection, whether direct or indirect. The phrases "on", "under", "left", "right" and the like, are only used to indicate a relative positional relationship, which may be correspondingly changed as an absolute position of a described object is changed.

The technical solutions in the embodiments of the present disclosure will be described clearly and completely with reference to the accompanying drawings of the embodiments of the present disclosure. Obviously, the embodiments to be described are only part of, rather than all of, the embodiments of the present disclosure. All other embodiments obtained by a person having ordinary skill in the art based on the embodiments of the present disclosure without any creative efforts shall fall within the scope of the present invention.

Figure 1:
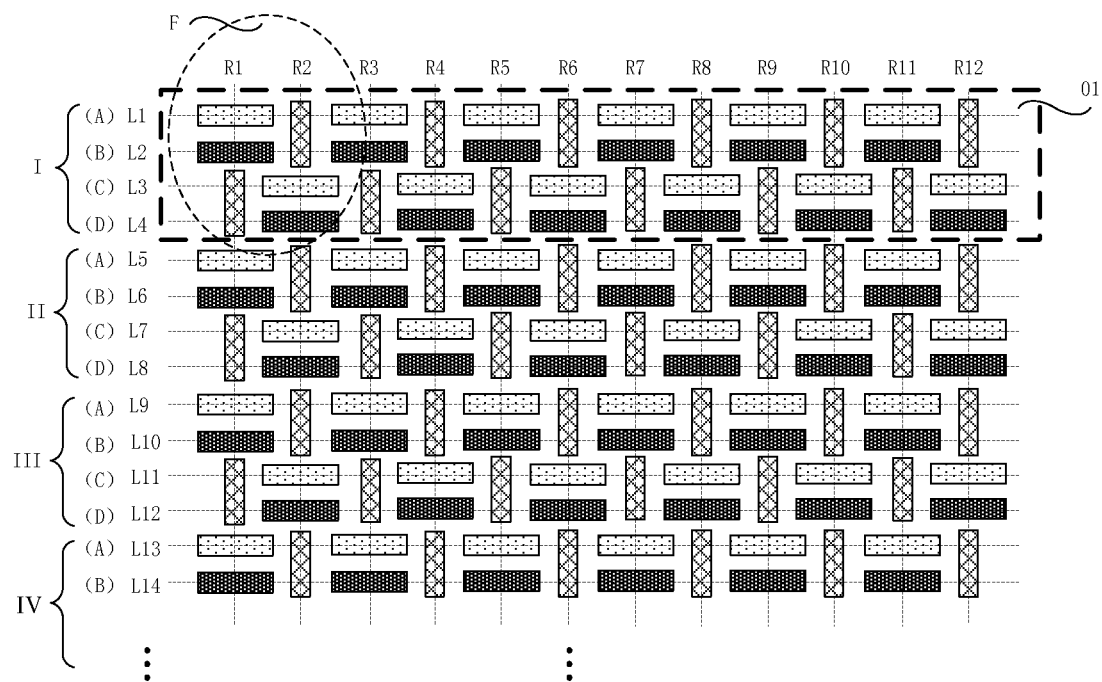
FIG. 1 illustrates a pixel arrangement structure provided on a display substrate provided in an embodiment of the present disclosure.
Figure 2A:
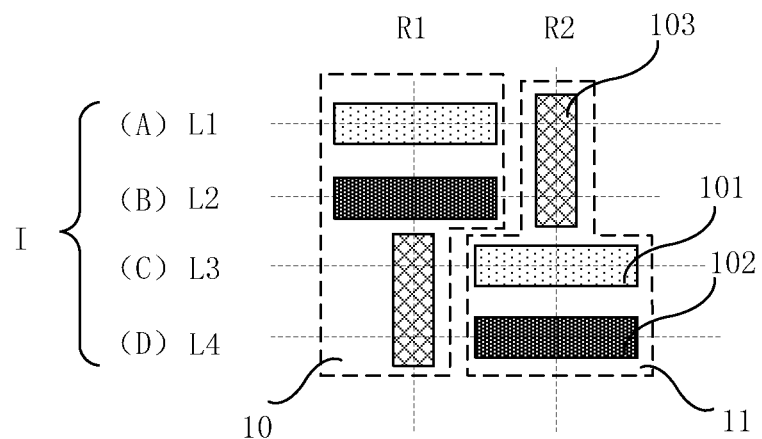
FIGS. 2a and 2b illustrate parts of the pixel arrangement structure provided in an embodiment of the present disclosure.

A pixel arrangement structure provided on a display substrate provided in an embodiment of the present disclosure, as shown in FIG. 1, may include pixel units 01 parallel to each other, the pixel units 01 each including a plurality of first pixels 10 and second pixels 11 spaced from each other (as shown in FIG. 2a, it is a partial enlarged view of position F in FIG. 1).

The first pixels 10 each may include a first sub-pixel 101 located in a first row A, a second sub-pixel 102 located in a second row B, and a third sub-pixel 103 located in a third row C and a fourth row D.

The second pixels 11 each may include a third sub-pixel 103 located in the first row A and the second row B, a first sub-pixel 101 located in the third row C, and a second sub-pixel 102 located in the fourth row D.

Wherein, the first sub-pixels 101 and second sub-pixels 102 may be arranged horizontally, while the third sub-pixels 103 may be arranged longitudinally.

It should be pointed out that the above first row A specifically refers to the position of a central line of the first sub-pixels 101 in the first pixels 10. Therefore, as for the pixel units 01 of Group I, the first row A is L1, while as for the pixel units 01 of Group II, the first row A is L5, and the markers of the first row A in other pixel units 01 (Groups III, IV . . . ) may be deduced alike.

The above second row B specifically refers to the position of a central line of the second sub-pixels 102 in the first pixels 10. Therefore, as for the pixel units 01 of Group I, the second row B is L2, while as for the pixel units 01 of Group II, the second row B is L6, and the markers of the second row B in other pixel units 01 (Groups III, IV . . . ) may be deduced alike.

The above third row C specifically refers to the position of a central line of the first sub-pixels 101 in the second pixels 11. Therefore, as for the pixel units 01 of Group I, the third row C is L3, while as for the pixel units 01 of Group II, the third row C is L7, and the markers of the third row C in other pixel units 01 (Groups III, IV . . . ) may be deduced alike.

The above fourth row D specifically refers to the position of a central line of the second sub-pixels 102 in the second pixels 11. Therefore, as for the pixel units 01 of Group I, the fourth row D is L4, while as for the pixel units 01 of Group II, the fourth row D is L8, and the markers of the fourth row D in other pixel units 01 (Groups III, IV . . . ) may be deduced alike.

It should be pointed out that the first sub-pixels 101 and second sub-pixels 102 being arranged horizontally means that the central lines of the first sub-pixels 101 and second sub-pixels 102 are parallel to the first row A, the second row B, the third row C or the fourth row D. The third sub-pixels 103 being arranged longitudinally means that the central line of the third sub-pixels 103 is perpendicular to the first row A, the second row B, the third row C or the fourth row D.

Figure 2B:
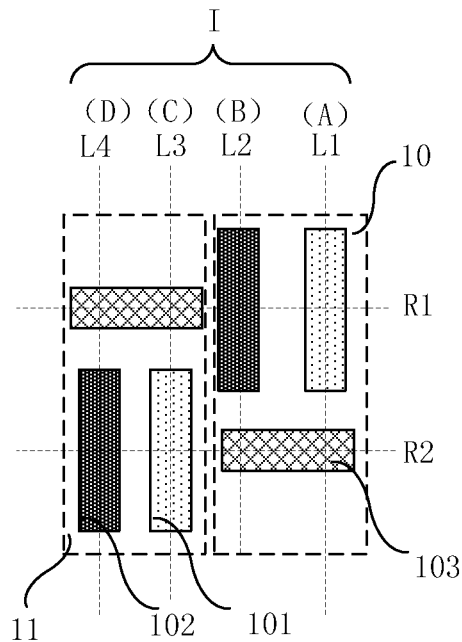

In addition, the above "row" and "column" are relative concepts. The "row" in the above description is described by taking the horizontal directions (L1, L2, L3. . . ) as an example, while the "column" is described by taking the vertical directions (R1, R2, R3. . . ) as an example. However, since the pixels are arranged in a matrix manner, rows and columns can be interchanged with each other when viewing directions are different. For example, as shown in FIG. 2b, (R1, R2, R3. . . ) can be considered as rows, and (L1, L2, L3. . . ) can be considered as columns.

On the basis of the above, the first pixels 10 each may include the first sub-pixel 101 located in the first row A (L1) from right to left, the second sub-pixel 102 located in the second row B (L2) and the third sub-pixel 103 located in the first column R1.

The second pixels 11 each may include the third sub-pixel 103 located in the second column R2, the first sub-pixel 101 located in the third row C (L3) and the second sub-pixel 102 located in the fourth row D (L4).

Wherein, the first sub-pixels 101 and the second sub-pixels 102 may also be arranged longitudinally (in the column direction), and the third sub-pixels 103 may also be arranged horizontally (in the row direction).

It can be seen that there is always one sub-pixel (the third sub-pixel 103) in the first pixel 10 and the second pixel 11 that is perpendicular to the other two sub-pixels (the first sub-pixel 101 and the second sub-pixel 102). Of course, what is described above is only illustrative description of the first pixel 10 and the second pixel 11 in the pixel arrangement structure as shown in FIG. 1 depending on different viewing directions, and other examples will not be described here one by one, but they should all fall into the protection scope of the present disclosure.

An embodiment of the present disclosure provides a pixel arrangement structure. The pixel arrangement structure includes pixel units parallel to each other, the pixel units each including: a plurality of first pixels and second pixels spaced from each other, the first pixels each including a first sub-pixel located in a first row, a second sub-pixel located in a second row, and a third sub-pixel located in third and fourth rows; the second pixels each including a third sub-pixel located in the first and second rows, a first sub-pixel located in the third row, and a second sub-pixel located in the fourth row. Herein, the first sub-pixels and second sub-pixels are arranged horizontally, while the third sub-pixels are arranged longitudinally. In this way, when the above pixel arrangement structure is configured to manufacture a display, a plurality of sampling areas may be provided on the pixel arrangement structure during the display process, a plurality of first pixels, second pixels or third pixels at a position corresponding to the sampling area can be shared, to improve the continuity of image display information at the above position of the sampling area. By means of the above virtual display driving, PPI can be increased, thereby improving the resolution of the display device and the quality and image quality effect of the display image.

Furthermore, the above first sub-pixel 101 may be red (R), the second sub-pixel 102 may be green (G), and the third sub-pixel 103 may be blue (B).

Alternatively, the above first sub-pixel 101 may be green (G), the second sub-pixel 102 may be blue (B), and the third sub-pixel 103 may be red (R).

Alternatively, the above first sub-pixel 101 may be blue (B), the second sub-pixel 102 may be red (R), and the third sub-pixel 103 may be green (G).

In this way, a person having ordinary skill in the art can design the colors of the above first sub-pixel 101, the second sub-pixel 102 and the third sub-pixel 103 as needed in the actual production, thereby enlarging the applicability range of the pixel arrangement structure.

It should be pointed out that in the embodiment of the present disclosure as shown in FIG. 1, description is made by taking the first sub-pixel 101 being blue (B), the second sub-pixel 102 being red (R), and the third sub-pixel 103 being green (G) as an example.

Furthermore, the shape of the above first sub-pixel, the second sub-pixel or the third sub-pixel may include rectangle. Since the display panel of a display device is rectangular, the area of the display panel can be utilized more efficiently if the shape of the above sub-pixel is designed to be rectangular alike.

Figure 3:
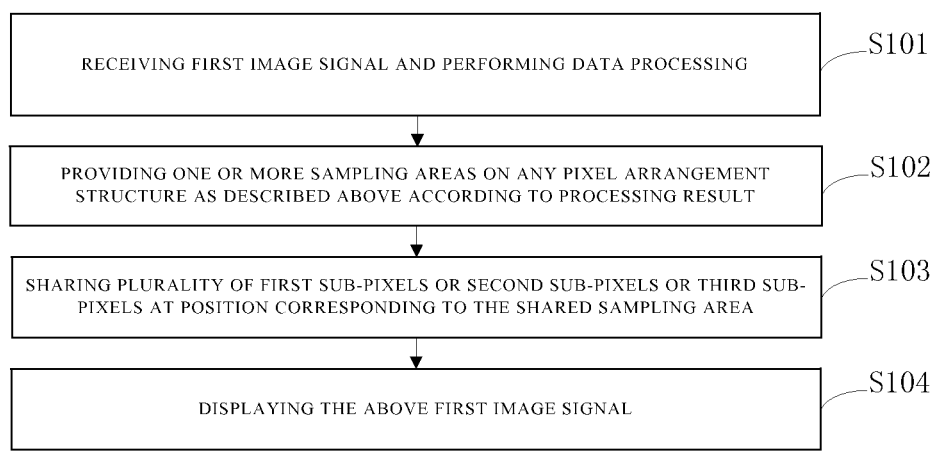
FIG. 3 is a flow chart of a display method provided in an embodiment of the present disclosure.
Figure 4:
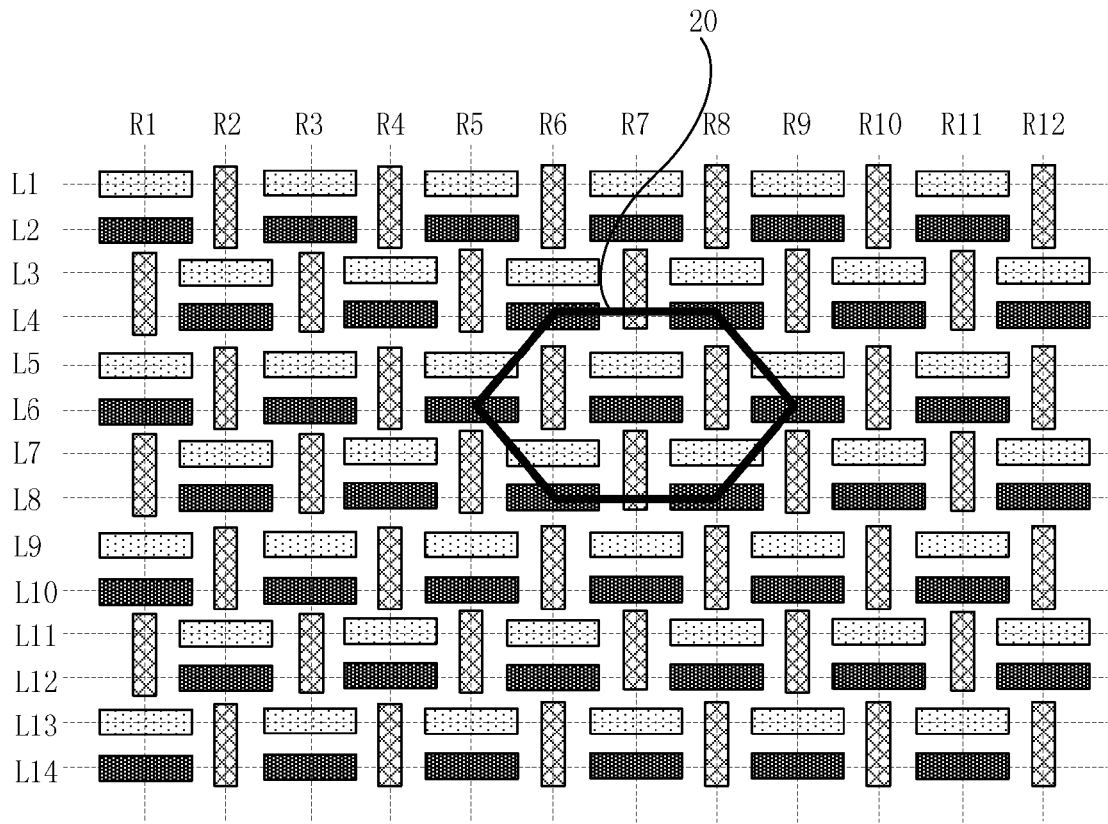
FIG. 4 illustrates a sampling area design provided in an embodiment of the present disclosure.

In addition, another embodiment of the present disclosure provides a display method, as shown in FIG. 3, which includes the following steps:

S101, receiving a first image signal and performing data processing;

S102, providing one or more sampling areas 20 (as shown in FIG. 4) on any pixel arrangement structure as described above according to a processing result;

S103, sharing a plurality of first sub-pixels 101 or second sub-pixels 102 or third sub-pixels 103 at a position corresponding to the shared sampling area 20 so as to output a display signal after pixel sharing;

S104, displaying the above first image signal according to the display signal after pixel sharing.

It should be pointed out that the above display signal after pixel sharing may be divided into primary display signal and shared signal. Herein, the primary display signal is a signal outputted by a sub-pixel primarily used for display in the sampling area 20, and the shared signal is a signal outputted by sub-pixels used for sharing other than the above sub-pixel primarily used for display in the sampling area 20.

Specifically, the display signal after pixel sharing may be transmitted to a pixel electrode of a display panel. Under a cooperation (an electric field produced) between the pixel electrode and a common electrode, liquid crystals at the position corresponding to the sampling area 20 is deflected in different directions according to the above primary display signal and shared display signals, and finally the first image signal is displayed on the display panel.

It should be pointed out that the sub-pixels at the position corresponding to the above shared sampling area 20 may refer to a certain type of sub-pixels in the region that may be covered by a plane where the shared sampling area 20 exists. As shown in FIG. 4, a shape of the sampling area 20 is hexagonal, and its corresponding position is the region that can be covered by the plane of the hexagon. Then, the multiple red sub-pixels (the second sub-pixels 102) at the position corresponding to the sampling area 20 can be shared, i.e., taking the second sub-pixel 102 with a coordinate of R7L6 located in the center of hexagon as a center, the six second sub-pixels 102 located on the contour of the hexagon are shared, and their coordinates are R6L4, R5L6, R6L8, R8L8, R9L6 and R8L4 respectively.

To be specific, according to the analysis and calculation result in step S101, a sampling area 20 matching with the above analysis result can be designed. For example, it is obtained from the analysis result in step S101 that the image to be displayed is a continuous picture, and in order to keep the continuity of the picture, a larger sampling area 20 may be set so that more first sub-pixels 101, second sub-pixels 102 or third sub-pixels 103 at the position corresponding to the sampling area 20 can be shared. For example again, when it is obtained from the analysis result in step S101 that the image to be displayed is a contour periphery, since image at the contour periphery varies greatly, the area of the sampling area 20 in step S102 may be reduced so as to reduce the number of the shared first sub-pixels 101, second sub-pixels 102 or third sub-pixels 103 at the position corresponding to the sampling area 20.

The present embodiment of the present disclosure provides a display method, which includes the following steps: receiving a first image signal and performing data processing; providing one or more sampling areas on a plurality of pixel arrangement structures provided on a display substrate according to a processing result; wherein, the pixel arrangement structure includes pixel units parallel to each other, the pixel units each including: a plurality of first pixels and second pixels spaced from each other, the first pixels each including a first sub-pixel located in a first row, a second sub-pixel located in a second row, and a third sub-pixel located in third and fourth rows; the second pixels each including a third sub-pixel located in the first and second rows, a first sub-pixel located in the third row, and a second sub-pixel located in the fourth row. Wherein, the first sub-pixels and second sub-pixels are arranged horizontally, while the third sub-pixels are arranged longitudinally; sharing a plurality of first sub-pixels or second sub-pixels or third sub-pixels at a position corresponding to the sampling area so as to output a display signal after pixel sharing; and displaying the first image signal. In this way, the continuity of image display information at the above position of the sampling area is improved by sharing a plurality of sub-pixel s, second sub-pixel s or third sub-pixel s at a position corresponding to the sampling area. By means of the above virtual display driving, PPI can be increased, thereby improving the resolution of the display device and the quality and image quality effect of the display image.

Figure 5:
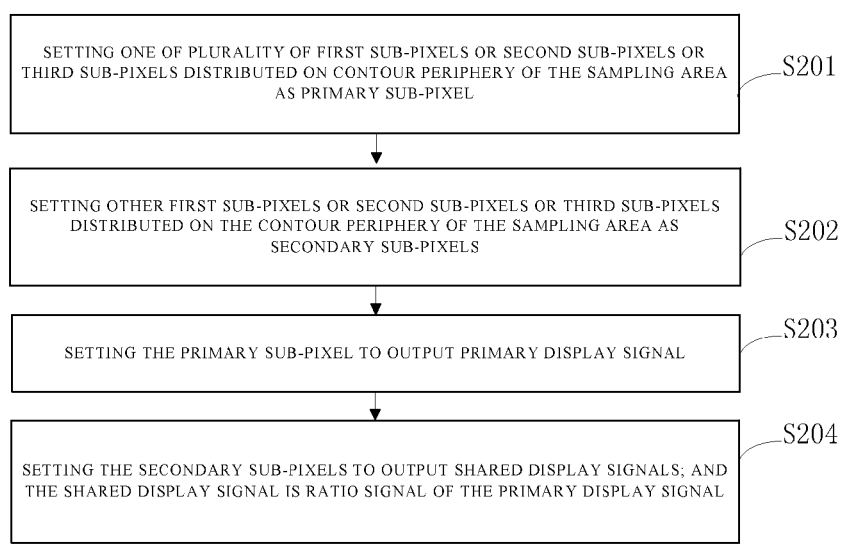
FIG. 5 is a flow chart of another display method provided in an embodiment of the present disclosure.
Figure 6:
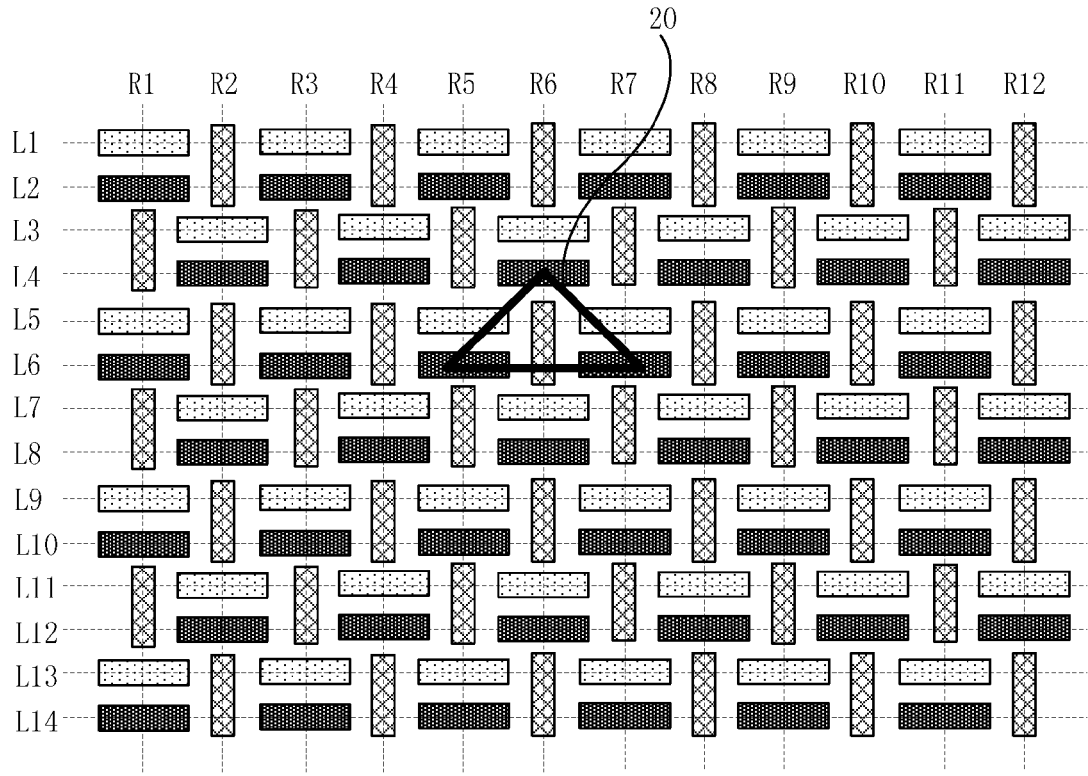
FIG. 6 illustrates another sampling area design provided in an embodiment of the present disclosure.

Furthermore, as shown in FIG. 5, the method of the above step S103 may include:

S201, setting one of a plurality of first sub-pixels 101 or second sub-pixels 102 or third sub-pixels 103 distributed on a contour periphery of the sampling area 20 as a primary sub-pixel. Specifically, as shown in FIG. 6, the second sub-pixel 102 (red) with a coordinate of R6L4 located on the contour periphery of the sampling area 20 is selected as the primary sub-pixel.

S202, setting other first sub-pixels 101 or second sub-pixels 102 or third sub-pixels 103 distributed on the contour periphery of the sampling area 20 as secondary sub-pixels. To be specific, the second sub-pixels 102 (red) with the coordinate positions of R5L6 and R7L6 respectively located on the contour periphery of the sampling area 20 as secondary sub-pixels.

S203, setting the primary sub-pixel to output a primary display signal.

S204, setting the secondary sub-pixels to output shared display signals, wherein the shared display signal is a ratio signal of the primary display signal.

It should be pointed out that in the embodiments of the present disclosure, the shared display signal being a ratio signal of the primary display signal means, as shown in FIG. 6, analyzing and processing the image to be displayed according to the above first image signal (for example, analyzing and processing information such as image quality, brightness, color and so on of the image to be displayed), determining a primary sub-pixel to output a primary display signal and obtaining, based on the above primary display signal, weights for respectively outputting signals to two secondary sub-pixels, the second sub-pixel 102 (R5L6) and the second sub-pixel 102 (R7L6). Therefore, signals with the above weights are ratio signals. Herein, a sum of the weights of various ratio signals may be 1.

It should be pointed out that, as shown in FIG. 6, the sampling area 20 is triangle-shaped, and shares two sub-pixels, i.e., the second sub-pixel 102 (R5L6) and the second sub-pixel 102 (R7L6). Since the area of the sampling area 20 is small and the number of shared sub-pixels is small, the calculation data corresponding to the sampling area vary greatly. The image at the contour periphery varies greatly, and thus can be used to display the contour periphery.

Figure 7:
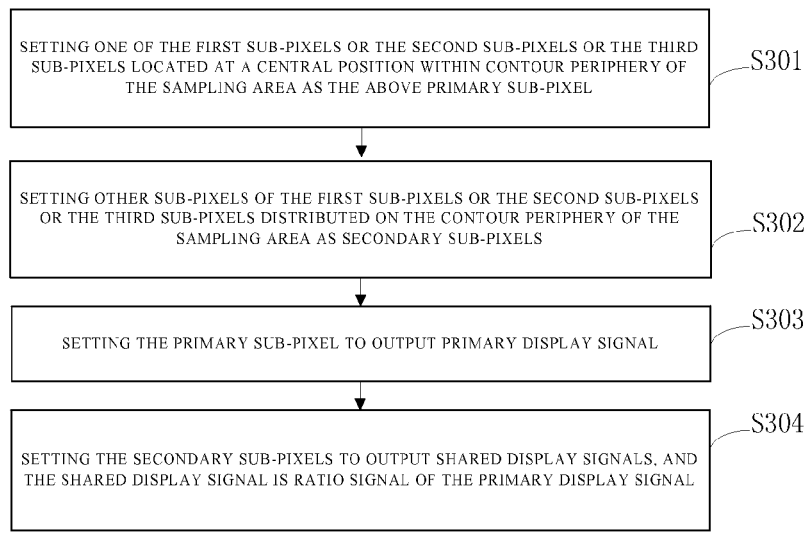
FIG. 7 is a flow chart of still another display method provided in an embodiment of the present disclosure.
Figure 8:
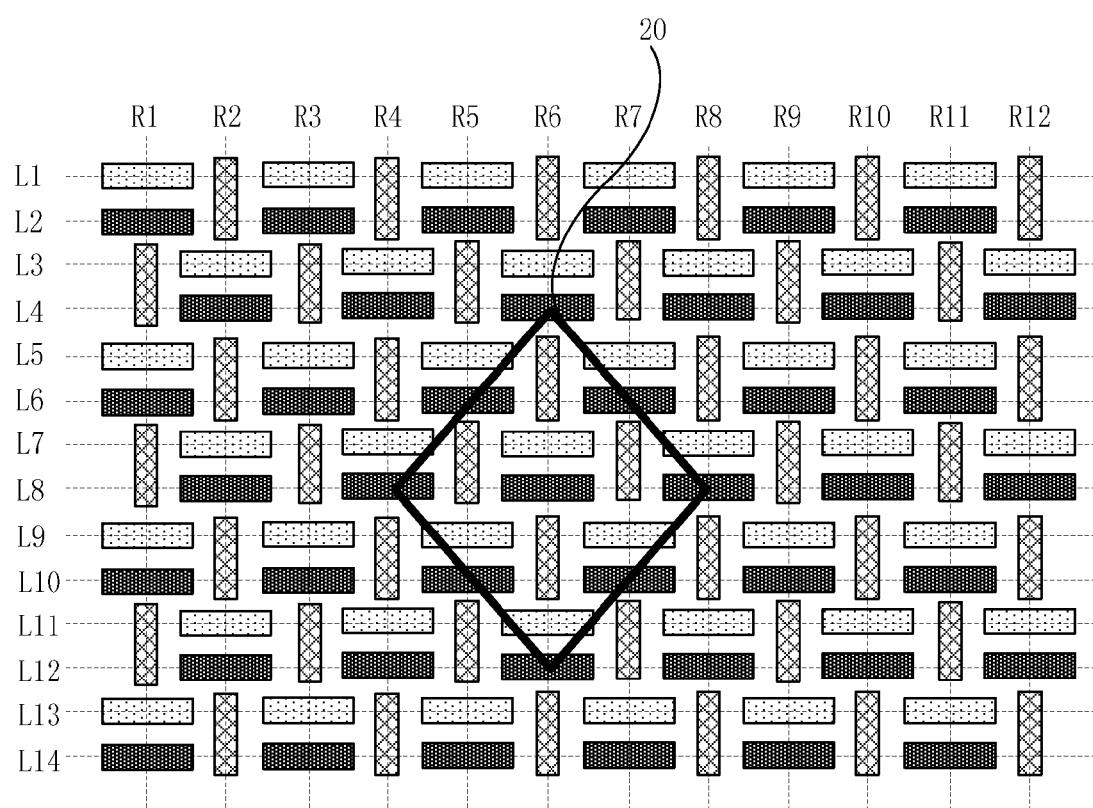
FIG. 8 illustrates still another sampling area design provided in an embodiment of the present disclosure.

Furthermore, as shown in FIG. 7, the method of the above step S103 may include:

S301, setting one of the first sub-pixels 101 or the second sub-pixels 102 or the third sub-pixels 103 located at a central position within a contour periphery of the sampling area 20 as a primary sub-pixel. Specifically, as shown in FIG. 8, the second sub-pixel 102 (R6L8) at the central position within a contour periphery of the sampling area 20 is the primary sub-pixel (red);

S302, setting other sub-pixels of the first sub-pixels 101 or the second sub-pixels 102 or the third sub-pixels 103 distributed on the contour periphery of the sampling area 20 as secondary sub-pixels. Specifically, the secondary sub-pixels on the contour periphery of the sampling area 20 include: the second sub-pixel 102 (R6L4), the second sub-pixel 102 (R4L8), the second sub-pixel 102 (R6L12) and the second sub-pixel 102 (R8L8);

S303, setting the primary sub-pixel to output a primary display signal;

S304, setting the secondary sub-pixels to output shared display signals. Herein, the shared display signal is a ratio signal of the primary display signal.

It should be pointed out that, as shown in FIG. 8, the sampling area 20 is rhombus-shaped, and shares four red sub-pixels, i.e., the second sub-pixel 102 (R6L4), the second sub-pixel 102 (R4L8), the second sub-pixel 102 (R6L12), and the second sub-pixel 102 (R8L8). Since the area of the sampling area 20 is big and the number of shared sub-pixels is large, the calculation area corresponding to the sampling area is even, and the data do not differ from each other greatly, it can be used to display continuous image, for example, continuous images of mountain, water, flower and bird.

Furthermore, when the first image signal is switched into a second image signal, and the second image signal is different from the first image signal, the method of the above step S102 may include:

changing a position of the primary sub-pixel so that the sampling area 20 matches with the second image signal.

Figure 9:
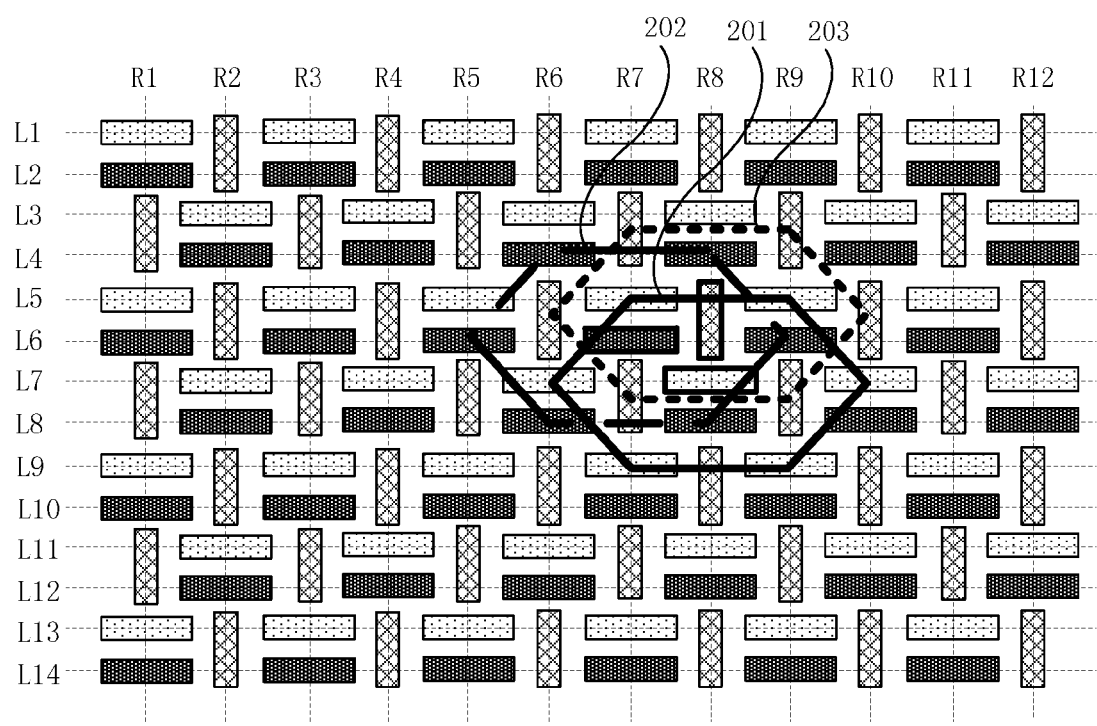
FIG. 9 illustrates virtual display in a sampling area design provided in an embodiment of the present disclosure.
Figure 10:
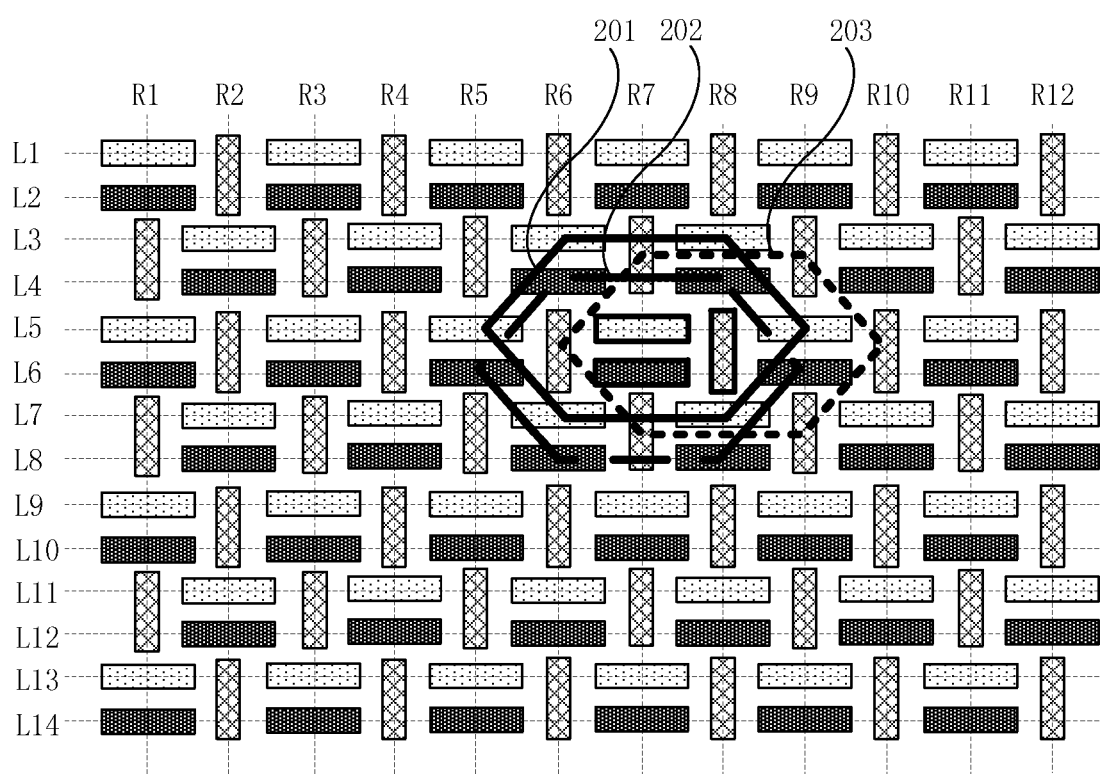
FIG. 10 illustrates virtual display in another sampling area design provided in an embodiment of the present disclosure.

Specifically, for example, when a received signal is a first image signal, and as shown in FIG. 9, the primary sub-pixels are respectively: first blue sub-pixel 101 (R8L7), second red sub-pixel 102 (R7L6) and third green sub-pixel (R8L5 or R8L6), three sampling areas 20 (blue sampling area 201, red sampling area 202 and green sampling area 203) are configured respectively to share the surrounding signal information, thereby enhancing the continuity of image information. When the first image signal is switched into a second image signal, it needs to change one of the primary sub-pixels, for example first blue sub-pixel 101 (R8L7), to the position R7L5, at which moment, the three sampling areas 20 matching with the second image signal are as shown in FIG. 10. In this way, by changing the positions of the primary sub-pixel and its shared secondary sub-pixels, the image to be displayed can be made to match with the input signal, thereby avoiding error display and improving the quality of the display device.

Furthermore, the method of the above step S 103 may further include:

in the sampling area 20, for example, setting a number of the secondary sub-pixels for sharing to be 2 to 8.

Figure 11:
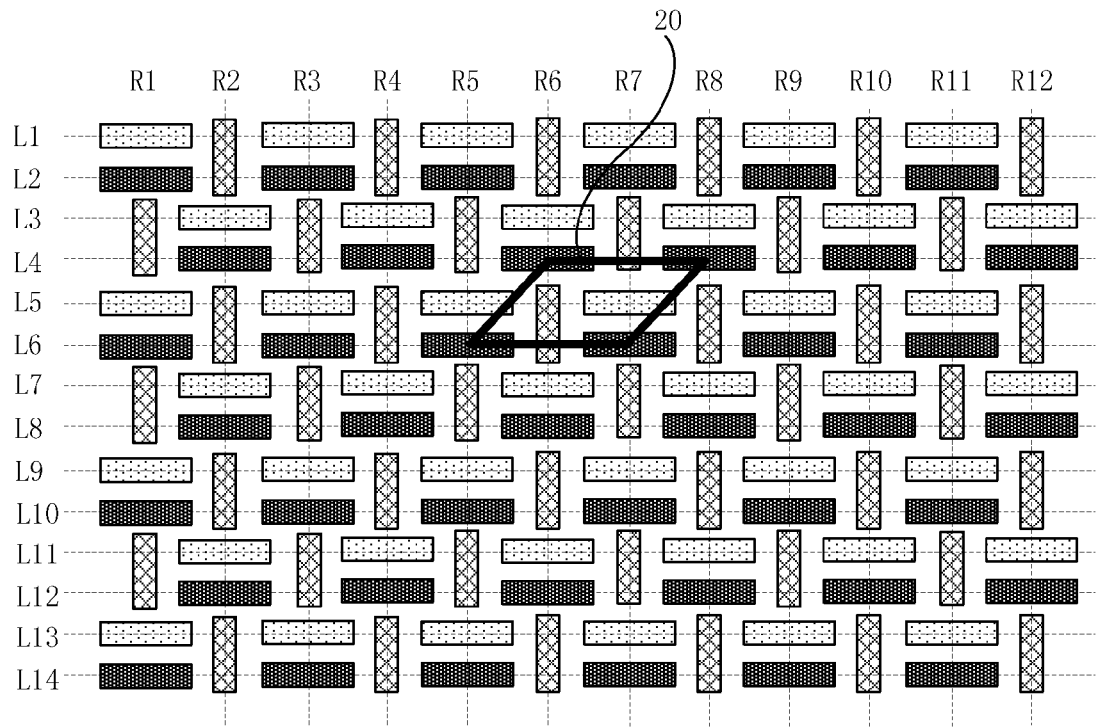
FIG. 11 illustrates still another sampling area design provided in an embodiment of the present disclosure.

Specifically, as shown in FIG. 6, when the sampling area 20 is triangle-shaped, two secondary sub-pixels, namely, the second sub-pixel 102 (R5L6) and the second sub-pixel 102 (R7L6), are shared. When the sampling area 20 is rhomboid-shaped as shown in FIG. 11, three secondary sub-pixels, namely, the second sub-pixel 102 (R6L4), the second sub-pixel 102 (R5L6) and the second sub-pixel 102 (R7L6), are shared Here, the primary sub-pixel is the second sub-pixel 102 (R8L4). The number of the shared sub-pixels is different as the shape and area of the sampling area 20 vary. However, when the number of the above secondary sub-pixels is less than 2, since the sampling area 20 cannot constitute a plane, the sampling area 20 cannot work normally. Nevertheless, when the number of the above secondary sub-pixels is greater than 8, the workload for processing data will be increased significantly, thus reducing the response speed of the display.

Of course, the above description is only an illustrative description of the shape of the sampling area 20, and other shapes will not be listed here one by one, but they shall all fall into the protection scope of the present disclosure. Moreover, a person having ordinary skill in the art may set a combination of a plurality of sampling areas of different shapes and positions on the above pixel arrangement structure to meet different requirements.

Furthermore, the above display method may further include:

setting the above first sub-pixel 101 to be red (R), the second sub-pixel 102 to be green (G), and the third sub-pixel 103 to be blue (B).

Alternatively, setting the above first sub-pixel 101 to be green (G), the second sub-pixel 102 to be blue (B), and the third sub-pixel 103 to be red (R).

Alternatively, setting the above first sub-pixel 101 to be blue (B), the second sub-pixel 102 to be red (R), and the third sub-pixel 103 to be green (G).

In this way, a person having ordinary skill in the art can design the colors of the above first sub-pixel 101, the second sub-pixel 102 and the third sub-pixel 103 as needed in the actual production, thereby enlarging the applicability range of the pixel arrangement structure.

Figure 12:
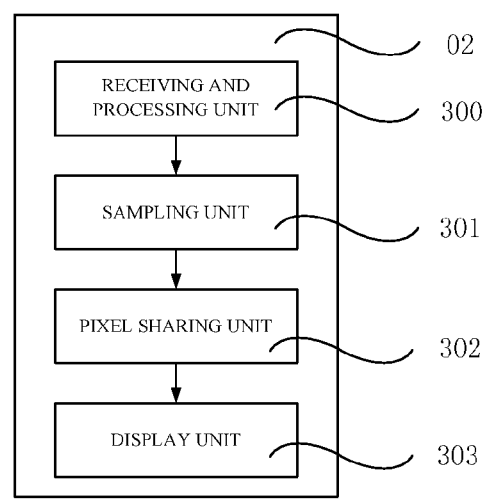
FIG. 12 illustrates a structure of a display device provided in an embodiment of the present disclosure.

Another embodiment of the present disclosure further provides a display device 02, as shown in FIG. 12, which includes:

a receiving and processing unit 300 configured to receive a first image signal and perform data processing;

a sampling unit 301 configured to provide one or more sampling areas 20 on the above pixel arrangement structure according to a processing result;

a pixel sharing unit 302 configured to share a plurality of first sub-pixels 101 or second sub-pixels 102 or third sub-pixels 103 at a position corresponding to the sampling area 20 so as to output a display signal after pixel sharing;

a display unit 303 configured to display the first image signal according to the display signal after pixel sharing.

The specific display process of the above display device 02 may be as follows: firstly, when a driver unit on the display device 02 transmits a first image signal, the receiving and processing unit 300 receives the first image signal and performs data processing. Specifically, analysis may be made on the first image signal, for example, to determine whether the display image corresponding to the first image signal is a continuous image or an image of a contour periphery, and the result of the above analysis and processing is transmitted to the sampling unit 301. Then, the sampling unit 301 determines the shape, position, number and the like of the sampling areas 20 needed to be divided according to the processing result, and provides the plurality of sampling areas 20 on the above pixel arrangement structure. Afterwards, the pixel sharing unit 302 shares the plurality of first sub-pixels 101 or second sub-pixels 102 or third sub-pixels 103 at the position corresponding to the sampling area 20. Specifically, corresponding to different sampling areas, a corresponding primary sub-pixel for outputting a primary display signal and secondary sub-pixels for outputting shared display signals are determined. Finally, the display unit 303 displays the first image signal according to the above primary display signal and shared display signals. Specifically, a pixel electrode of the display unit 303 can receive the above primary display signal and shared display signals, and under a cooperation (an electric field produced) between the pixel electrode and a common electrode, liquid crystals at the position corresponding to the sampling area 20 is deflected in different directions according to the above primary display signal and shared display signals, and the first image signal is displayed on the display unit 303.

It should be pointed out that the sub-pixels at the position corresponding to the above shared sampling area 20 may refer to a certain type of sub-pixels in the region that may be covered by a plane where the shared sampling area 20 exists. As shown in FIG. 4, a shape of the sampling area 20 is hexagonal, and its corresponding position is the region that can be covered by the plane of the hexagon. Then, the multiple red sub-pixels (the second sub-pixels 102) at the position corresponding to the sampling area 20 can be shared, i.e., taking the second sub-pixel 102 with a coordinate of R7L6 located in the center of hexagon as a center, the six second sub-pixels 102 located on the contour of the hexagon are shared, and their coordinates are R6L4, R5L6, R6L8, R8L8, R9L6 and R8L4 respectively.

To be specific, according to the analysis and calculation result of the receiving and processing unit 300, a sampling area 20 matching with the above analysis result can be designed. For example, it is obtained from the analysis result in the receiving and processing unit 300 that the image to be displayed is a continuous picture, and in order to keep the continuity of the picture, a larger sampling area 20 may be set so that more first sub-pixels 101, second sub-pixels 102 or third sub-pixels 103 at the position corresponding to the sampling area 20 can be shared. For example again, when it is obtained from the analysis result in the receiving and processing unit 300 that the image to be displayed is a contour periphery, since image at the contour periphery varies greatly, the area of the sampling area 20 in step S102 may be reduced so as to reduce the number of the shared first sub-pixels 101, second sub-pixels 102 or third sub-pixels 103 at the position corresponding to the sampling area 20.

Another embodiment of the present disclosure further provides a display device, which may specifically include a liquid crystal display device, for example, the display device may be any products or parts having a display function such as a liquid crystal display (LCD), a liquid crystal television, a digital photo frame, a mobile phone, a tablet PC, etc.

Another embodiment of the present disclosure further provides a display device, which includes: a receiving and processing unit configured to receive a first image signal and perform data processing; a sampling unit configured to provide one or more sampling areas on a pixel arrangement structure according to a processing result; wherein, the pixel arrangement structures may include pixel units parallel to each other, and the pixel units each may include a plurality of first pixels and second pixels spaced from each other, the first pixels each including a first sub-pixel located in a first row, a second sub-pixel located in a second row, and a third sub-pixel located in third and fourth rows, the second pixels each including a third sub-pixel located in the first and second rows, a first sub-pixel located in the third row, and a second sub-pixel located in the fourth row, the first sub-pixels and second sub-pixels being arranged horizontally, while the third sub-pixels being arranged longitudinally; a pixel sharing unit configured to share a plurality of first sub-pixels or second sub-pixels or third sub-pixels at a position corresponding to the sampling area; and a display unit configured to display the first image signal. In this way, the continuity of image display information at the above position of the sampling area is improved by sharing a plurality of first pixels, second pixels or third pixels at a position corresponding to the sampling area. By means of the above virtual display driving, PPI can be increased, thereby improving the resolution of the display device and the quality and image quality effect of the display image.

A person having ordinary skill in the art should appreciate that all or part of the steps in the above method embodiment may be implemented by instructing related hardware with a program, which may be stored in a computer-readable memory medium and executes the steps of the above method embodiment during execution. The aforesaid memory medium includes various media that can store program codes such as a ROM, a RAM, a magnetic disk or an optical disk.

What is describe above is only specific embodiments of the present disclosure. However, the protection scope of the present disclosure is not limited thereto, and any change or substitution that can be readily conceived by a person skilled in the art within the technical scope of the present disclosure shall fall within the protection scope of the present disclosure. Therefore, the protection scope of the present disclosure should be defined by the claims.

What is claimed is:

1. A pixel arrangement structure comprising pixel units parallel to each other, the pixel units each comprising a plurality of first pixels and second pixels spaced from each other;
    wherein the first pixels each comprises a first sub-pixel located in a first row, a second sub-pixel located in a second row, and a third sub-pixel located in third and fourth rows;
    the second pixels each comprises a third sub-pixel located in the first and second rows, a first sub-pixel located in the third row, and a second sub-pixel located in the fourth row; and
    the first sub-pixels and second sub-pixels are arranged horizontally, while the third sub-pixels are arranged longitudinally.

2. The pixel arrangement structure according to claim 1, wherein
    the first sub-pixel is red, the second sub-pixel is green, and the third sub-pixel is blue.

3. The pixel arrangement structure according to claim 1, wherein
    the first sub-pixel is green, the second sub-pixel is blue, and the third sub-pixel is red.

4. The pixel arrangement structure according to claim 1, wherein
    the first sub-pixel is blue, the second sub-pixel is red, and the third sub-pixel is green.

5. The pixel arrangement structure according to claim 1, wherein a shape of the first sub-pixel, the second sub-pixel or the third sub-pixel includes rectangle.

6. A display device, comprising:
    a receiving and processing unit configured to receive a first image signal and perform data processing;
    a sampling unit configured to provide one or more sampling areas on a plurality of pixel arrangement structures provided on a display substrate according to a processing result;
    a pixel sharing unit configured to share a plurality of first sub-pixels or second sub-pixels or third sub-pixels at a position corresponding to the sampling area so as to output a display signal after pixel sharing; and
    a display unit configured to display the first image signal according to the display signal after pixel sharing,
    wherein each of the plurality of pixel arrangement structures comprises pixel units parallel to each other, and the pixel units each comprises a plurality of first pixels and second pixels spaced from each other;
    the first pixels each comprises a the first sub-pixel located in a first row, a the second sub-pixel located in a second row, and a the third sub-pixel located in third and fourth rows;
    the second pixels each comprises a third sub-pixel located in the first and second rows, a first sub-pixel located in the third row, and a second sub-pixel located in the fourth row; and
    the first sub-pixels and second sub-pixels are arranged horizontally, while the third sub-pixels are arranged longitudinally.

7. The display device according to claim 6, wherein a shape of the sampling area is configured to be triangular, rhombic or hexagonal.

8. The display device according to claim 6, wherein the first sub-pixel is red, the second sub-pixel is green, and the third sub-pixel is blue.

9. The display device according to claim 6, wherein the first sub-pixel is green, the second sub-pixel is blue, and the third sub-pixel is red.

10. The display device according to claim 6, wherein the first sub-pixel is blue, the second sub-pixel is red, and the third sub-pixel is green.

11. The display device according to claim 6, wherein a shape of the first sub-pixel, the second sub-pixel or the third sub-pixel includes rectangle.

12. A display method, comprising:
receiving a first image signal and performing data processing;
providing one or more sampling areas on a plurality of pixel arrangement structures provided on a display substrate according to a processing result;
sharing a plurality of first sub-pixels or second sub-pixels or third sub-pixels at a position corresponding to the sampling area so as to output a display signal after pixel sharing; and
displaying the first image signal according to the display signal after pixel sharing,
wherein each of the plurality of pixel arrangement structures comprises pixel units parallel to each other, the pixel units each comprising a plurality of first pixels and second pixels spaced from each other;
wherein the first pixels each comprise a first sub-pixel located in a first row, a second sub-pixel located in a second row, and a third sub-pixel located in third and fourth rows:
wherein the second pixels each comprise a third sub-pixel located in the first and second rows, a first sub-pixel located in the third row, and a second sub-pixel located in the fourth row; and
wherein the first sub-pixels and second sub-pixels are arranged horizontally, while the third sub-pixels are arranged longitudinally.

13. The method according to claim 12, wherein the step of sharing a plurality of first sub-pixels or second sub-pixels or third sub-pixels at a position corresponding to the sampling area comprises:
setting one of the plurality of first sub-pixels or second sub-pixels or third sub-pixels distributed on a contour periphery of the sampling area as a primary sub-pixel;
setting other sub-pixels of the plurality of first sub-pixels or second sub-pixels or third sub-pixels distributed on the contour periphery of the sampling area as secondary sub-pixels;
setting the primary sub-pixel to output a primary display signal;
setting the secondary sub-pixels to output shared display signals, wherein the shared display signal is a ratio signal of the primary display signal.

14. The method according to claim 12, wherein the step of sharing a plurality of first sub-pixels or second sub-pixels or third sub-pixels at a position corresponding to the sampling area comprises:
setting one of the first sub-pixels or the second sub-pixels or the third sub-pixels located at a central position within a contour periphery of the sampling area as a primary sub-pixel;
setting other sub-pixels of the first sub-pixels or the second sub-pixels or the third sub-pixels distributed on the contour periphery of the sampling area as secondary sub-pixels;
setting the primary sub-pixel to output a primary display signal;
setting the secondary sub-pixels to output shared display signals, wherein the shared display signal is a ratio signal of the primary display signal.

15. The method according to claim 13, further comprising:
when the first image signal is switched into a second image signal, and the second image signal is different from the first image signal,
changing a position of the primary sub-pixel so that the sampling area matches with the second image signal.

16. The method according to claim 13, wherein within the sampling area, a number of the secondary sub-pixels for sharing is configured to be 2 to 8.

17. The method according to claim 16, wherein a shape of the sampling area is configured to be triangular, rhombic or hexagonal.

18. The method according to claim 12, further comprising:
setting the first sub-pixel to be red, the second sub-pixel to be green, and the third sub-pixel to be blue.

19. The method according to claim 12, further comprising:
setting the first sub-pixel to be green, the second sub-pixel to be blue, and the third sub-pixel to be red.

20. The method according to claim 12, further comprising:
setting the first sub-pixel to be blue, the second sub-pixel to be red, and the third sub-pixel to be green.

* * * * *